(12) United States Patent
Tanaka et al.

(10) Patent No.: US 12,345,782 B2
(45) Date of Patent: Jul. 1, 2025

(54) MAGNETIC SENSOR

(71) Applicant: Asahi Kasei Microdevices Corporation, Tokyo (JP)

(72) Inventors: Ken Tanaka, Tokyo (JP); Kenji Kai, Tokyo (JP); Takuya Ishida, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 17/952,362

(22) Filed: Sep. 26, 2022

(65) Prior Publication Data

US 2023/0094395 A1 Mar. 30, 2023

(30) Foreign Application Priority Data

Sep. 29, 2021 (JP) ................... 2021-159555
Aug. 3, 2022 (JP) ................... 2022-124140

(51) Int. Cl.
*G01R 33/07* (2006.01)
*H10N 52/00* (2023.01)
*H10N 52/80* (2023.01)

(52) U.S. Cl.
CPC ........... *G01R 33/072* (2013.01); *H10N 52/00* (2023.02); *H10N 52/80* (2023.02)

(58) Field of Classification Search
CPC .... G01R 33/07; G01R 33/072; G01R 33/074; G01R 33/077; G01R 33/09; G01R 33/091; G01R 33/093; G01R 33/095; G01R 33/096; G01R 33/098; G01R 33/0047; G01R 15/20; G01R 15/202; G01R 15/205; G01R 15/207; H10N 50/10; H10N 50/20; H10N 50/80; H10N 50/85; H10N 52/00; H10N 52/01; H10N 52/101; H10N 52/80; H10N 52/85; H10N 59/00

See application file for complete search history.

(56) References Cited

U.S. PATENT DOCUMENTS

| 9,535,139 | B2* | 1/2017 | Nishida | ........... G01R 33/07 |
| 11,621,215 | B1* | 4/2023 | Tuncer | ............. H01L 24/85 |
| | | | | 324/126 |
| 2014/0167736 | A1 | 6/2014 | Suzuki | |
| 2016/0187388 | A1 | 6/2016 | Suzuki | |
| 2017/0160313 | A1* | 6/2017 | Koiwa | ........... G01R 15/202 |
| 2020/0056910 | A1* | 2/2020 | Strutz | ........... G01R 33/0076 |
| 2020/0233044 | A1 | 7/2020 | Dangelmaier | |

(Continued)

FOREIGN PATENT DOCUMENTS

DE 102011088197 A1 * 6/2013 ........... G01R 33/096
JP 2018036237 A 3/2018

*Primary Examiner* — David M Schindler

(57) ABSTRACT

A die pad, a signal processing IC, an adhesive layer, and at least one magnetoelectric conversion element included in a magnetic sensor are encapsulated by a molding resin. At least a part of the first end surface of the signal processing IC is positioned on a side closer to the at least one magnetoelectric conversion element than a first end surface of the die pad on a side of the at least one magnetoelectric conversion element in a plan view. An isolation portion into which the molding resin enters is provided between the first surface of the die pad on a side of the first end surface, and the first surface of the signal processing IC on a side of the first end surface, and a thickness of the isolation portion is smaller than a thickness of the die pad.

19 Claims, 11 Drawing Sheets

(56) References Cited

U.S. PATENT DOCUMENTS

| | | | |
|---|---|---|---|
| 2023/0245957 A1* | 8/2023 | Tuncer ............... | G01R 19/0092 |
| | | | 324/126 |
| 2023/0261118 A1* | 8/2023 | Vig .................... | G01R 33/0052 |
| | | | 324/252 |

* cited by examiner

MAGNETIC SENSOR

The contents of the following Japanese patent application(s) are incorporated herein by reference:
NO. 2021-159555 filed in JP on Sep. 29, 2021
NO. 2022-124140 filed in JP on Aug. 3, 2022

BACKGROUND

1. Technical Field

The present invention relates to a magnetic sensor. The contents of the following Japanese patent application(s) are incorporated herein by reference:
NO. 2021-159555 filed in JP on Sep. 29, 2021
NO. 2022-124140 filed in JP on Aug. 3, 2022

2. Related Art

Patent Document 1 and Patent Document 2 disclose a current sensor which has a magnetoelectric conversion element and detects current based on magnetic flux density generated by current.

PRIOR ART DOCUMENTS

Patent Documents

Patent Document 1: Japanese Patent No. 6415148
Patent Document 2: Japanese Patent No. 5695195

DESCRIPTION OF EXEMPLARY EMBODIMENTS

Figure 1A:
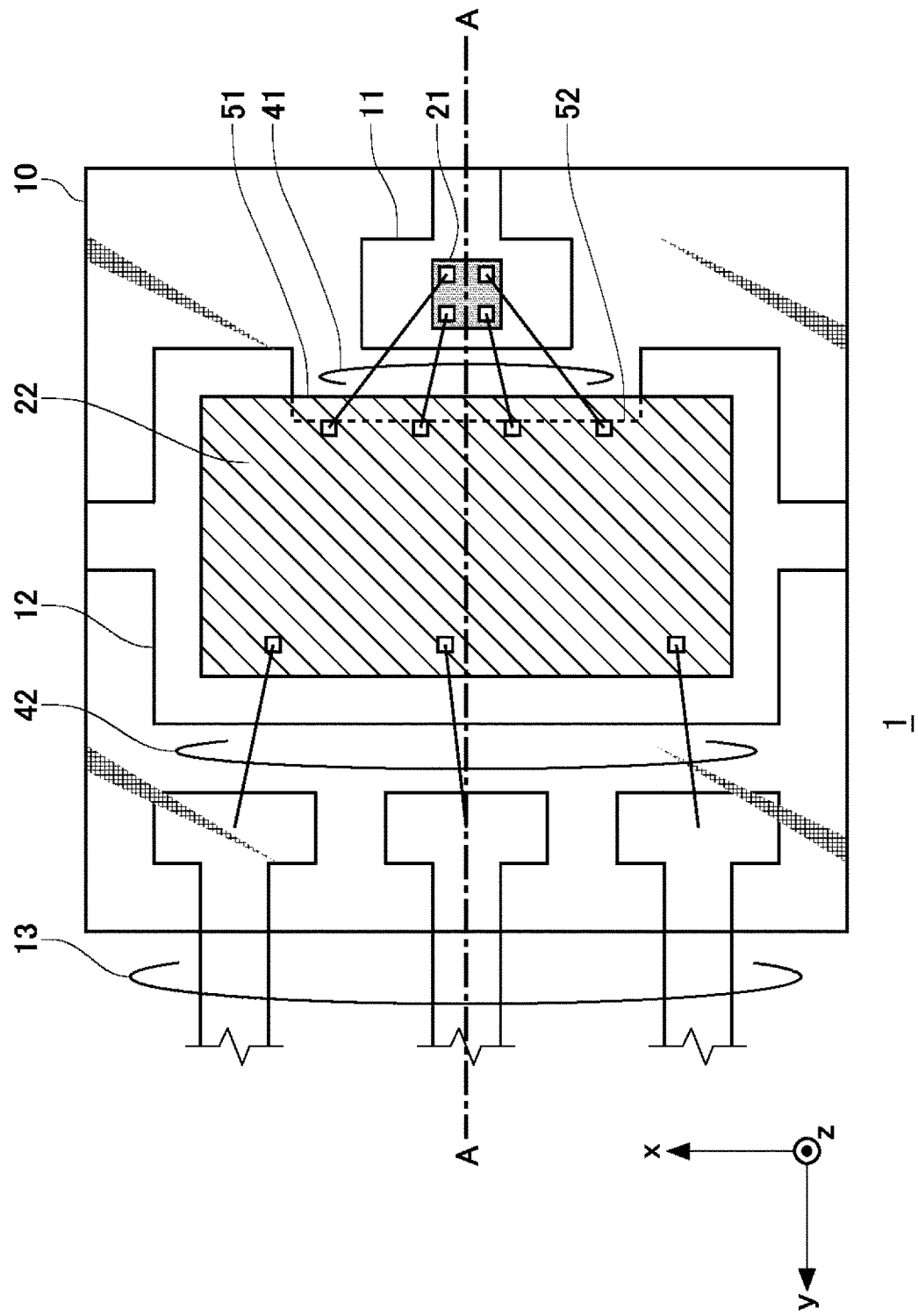
FIG. 1A is a top view of a configuration inside a semiconductor package for functioning as a magnetic sensor according to a first embodiment.

Hereinafter, the present invention will be described through embodiments of the invention, but the following embodiments do not limit the invention according to the claims. In addition, not all combinations of features described in the embodiments may not necessarily be essential to solving means of the invention.

Hereinafter, a magnetic sensor will be described, which has a magnetoelectric conversion element and outputs a signal according to a magnitude of a magnetic field. The magnetoelectric conversion element is an element for converting to voltage or current according to a magnitude of a magnetic field input into the element, and outputting the converted voltage or current. The magnetoelectric conversion element usually outputs a small signal, and has a poor magnetic sensitivity against a temperature characteristic. Because of that, a magnetoelectric conversion element is encapsulated by molding resin together with a signal processing IC including a signal processing circuit for amplifying an output signal of the magnetoelectric conversion element, and for correcting a temperature characteristic for magnetic sensitivity. The encapsulated magnetoelectric conversion element and the signal processing IC constitute a semiconductor package.

For example, Patent Document 1 discloses a current sensor constituted by a primary conductor of a U-shape, a magnetoelectric conversion element arranged in an opening of the primary conductor, and a signal processing IC. A magnetic field generated by current flowing in the primary conductor is detected by the magnetoelectric conversion element, and a signal according to a magnitude of current is amplified and output by a signal processing circuit of the signal processing IC placed on a broad die pad.

Patent Document 2 discloses a current sensor constituted by a signal processing IC with a signal processing circuit including a magnetoelectric conversion element and a primary conductor. A magnetic field generated by current flowing in the primary conductor is detected by the magnetoelectric conversion element arranged so as to protrude from a die pad, and a signal according to a magnitude of current is amplified and output by the signal processing circuit.

However, a current sensor described in Patent Document 1 has a signal processing IC arranged inside a die pad and so a length of wires connecting the signal processing IC and a magnetoelectric conversion element becomes longer, which may result in being affected by external noise. Specifically, because the primary conductor generates a strong electric field or a magnetic field of a high frequency, a noise voltage may be induced to wires by electrostatic coupling or inductive coupling.

The current sensor described in Patent Document 2 has the magnetoelectric conversion element arranged at a position away from the primary conductor, and thus a magnetic field which is generated by current and then inputs into the magnetoelectric conversion element is drastically decreased, which may result in a significantly lower sensitivity.

In Patent Documents 1 and 2, a delamination or a crack to occur in the semiconductor package is not considered.

A magnetic sensor provided according to the present embodiment reduces impact of external noise, and is a small and highly sensitive sensor also having an excellent quality without any delamination or crack.

Figure 1B:
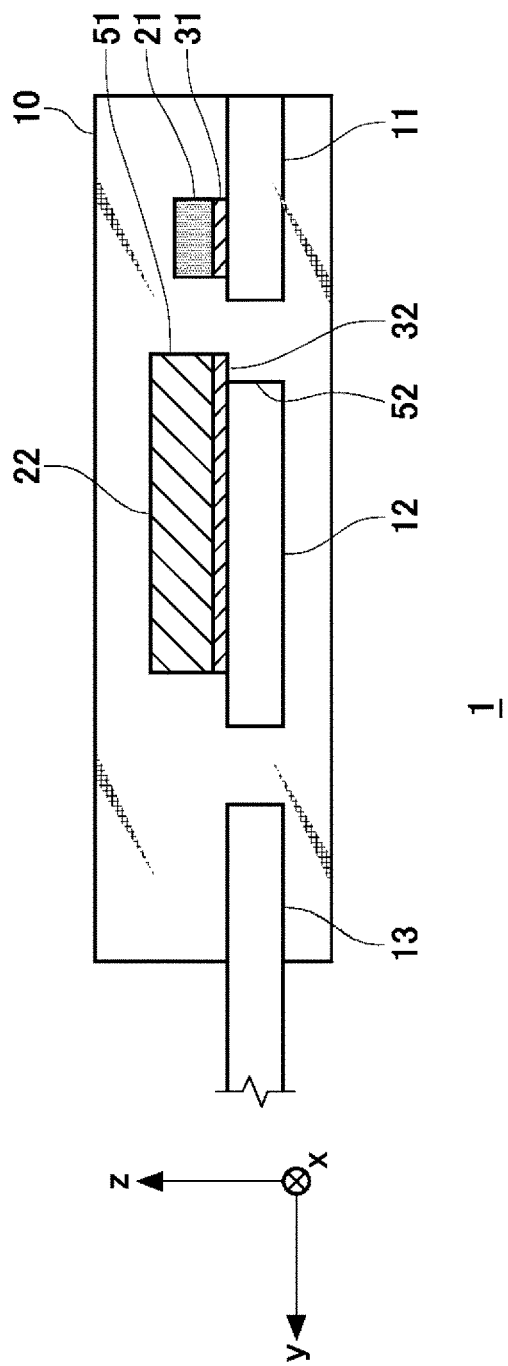
FIG. 1B is a cross-section taken along a line A-A of FIG. 1A.

FIGS. 1A and 1B illustrate a configuration inside a semiconductor package for functioning as a magnetic sensor 1 according to a first embodiment. FIG. 1A is a top view of a plan view seen from a z axis direction. FIG. 1B is a cross-section taken along a line A-A of FIG. 1A. As illustrated in FIGS. 1A and 1B, the magnetic sensor 1 includes a molding resin 10, a magnetoelectric conversion element die pad 11, a signal processing IC die pad 12, lead terminals 13, a magnetoelectric conversion element 21, a signal processing IC 22, die-attach films 31 and 32, and wires 41 and 42, for example.

Coordinates for FIG. 1A are defined as: an x axis direction being an orientation from bottom to top in parallel to the sheet of the drawing; a y axis direction being an orientation from right to left in parallel to the sheet of the drawing; a z axis direction being an orientation from back to front in perpendicular to the sheet of the drawing. Any one of an x axis, a y axis, and a z axis crosses another axis at a right angle.

The magnetoelectric conversion element 21 detects a magnetic field in a particular direction, the signal processing IC 22 amplifies a signal according to a magnitude of the magnetic field, and the signal amplified is output from the lead terminals 13.

The magnetoelectric conversion element 21 has a rectangular shape or a square shape in a plan view seen from the z axis direction. The magnetoelectric conversion element 21 has a substrate consisting of silicon or compound semiconductor, and a magnetoelectric converter disposed on the substrate. A thickness of the substrate is adjusted by polishing its surface on a −z axis direction side. The substrate has a desired thickness ranging from 50 μm to 600 μm.

In a case of detecting a magnetic field in the z axis direction, a hall element is appropriate for the magnetoelectric conversion element 21. Alternatively, in a case of detecting a magnetic field in any one axis direction on the x-y plane, e.g., in a case of detecting a magnetic field in the x axis direction, a magneto-resistance element or a flux-gate element is appropriate for the magnetoelectric conversion element 21.

The signal processing IC 22 has a rectangular shape or a square shape in a plan view. The signal processing IC 22 has a substrate consisting of silicon or compound semiconductor, and a signal processing circuit disposed on the substrate. A thickness of the substrate is adjusted by polishing its surface on a −z axis direction side. The substrate has a desired thickness ranging from 50 μm to 600 μm. The signal processing circuit has at least a circuit to input a quite small output signal from the magnetoelectric conversion element 21 according to a magnitude of a magnetic field, and to amplify an input signal.

The wires 41 electrically connect electrode pads disposed on the signal processing IC 22 and electrode pads disposed on the magnetoelectric conversion element 21. The wires 42 electrically connect electrode pads disposed on the signal processing IC 22 and bonding pads disposed on the lead terminals 13. The wires 41 and 42 are formed of a conductor material of which main component being Au, Ag, Cu, or Al.

The magnetoelectric conversion element die pad 11, signal processing IC die pad 12, and lead terminals 13 are formed from a lead frame made of a conductor material of which main component being Cu. The lead frame has a desired thickness ranging from 50 μm to 600 μm. The magnetoelectric conversion element die pad 11 is a land for placing the magnetoelectric conversion element 21. The signal processing IC die pad 12 is a land for placing the signal processing IC 22. The signal processing IC die pad 12 is in a C-shape in the plan view because a space of a certain interval or more is needed between the magnetoelectric conversion element die pad 11 and the signal processing IC die pad 12. The lead terminals 13 are leads for supplying power to the signal processing circuit of the signal processing IC 22, and for inputting/outputting signals.

The die-attach film 31 is an adhesive layer for bonding the magnetoelectric conversion element 21 and the magnetoelectric conversion element die pad 11 together. The die-attach film 31 bonds a surface of the magnetoelectric conversion element die pad 11 facing the magnetoelectric conversion element 21, and a surface of the magnetoelectric conversion element 21 facing the magnetoelectric conversion element die pad 11 together.

The die-attach film 32 is an adhesive layer for bonding the signal processing IC 22 and the signal processing IC die pad 12 together. The die-attach film 32 bonds a surface of the signal processing IC 22 facing the signal processing IC die pad 12, and a surface of the signal processing IC die pad 12 facing the signal processing IC 22 together.

In the plan view, the die-attach film 31 and the die-attach film 32 are respectively identical in shape with the magnetoelectric conversion element 21, and the signal processing IC 22. This is due to a manufacturing method of dicing the substrate of the signal processing circuit mounted on a dicing tape, where an adhesive layer of a dicing tape of the die-attach film 32 is cut together with the signal processing IC 22 and gets attached to a surface of the signal processing IC 22 on a side of a dicing tape. The same applies to the die-attach film 31. The die-attach films 31 and 32 may consist of non-conductive resin, or conductive resin. The non-conductive resin includes epoxy-based resin. The conductive resin includes epoxy-based resin mixed with Ag filler. The die-attach films 31 and 32 have a desired thickness ranging from 1 μm to 50 μm.

For example, thermosetting epoxy resin added with silica is used for the molding resin 10, and the semiconductor package is molded by transfer molding. Molded molding resin 10 completely encapsulates the magnetoelectric conversion element 21, the signal processing IC 22, the wires 41, and the wires 42.

In the plan view of four sides of the signal processing IC 22 in a rectangular shape or a square shape, at least a part of an end surface 51 on a side of the magnetoelectric conversion element 21 including a side of the four closest to the magnetoelectric conversion element 21 is arranged on an outer side of the signal processing IC die pad 12 than an end surface 52 of the signal processing IC die pad 12 on the side of the magnetoelectric conversion element 21. The magnetoelectric conversion element 21 is arranged facing the end surface 51 of the signal processing IC. This shortens lengths of the wires 41 connecting the signal processing IC 22 and the magnetoelectric conversion element 21. Therefore, impact of unexpected external noise, such as a noise voltage induced to wires because of electrostatic coupling or inductive coupling, can be reduced. Further, an outline of the magnetic sensor 1 in the y axis direction becomes smaller, so that the magnetic sensor 1 can be miniaturized.

In the plan view of the magnetic sensor 1, at least one end surface, preferably three end surfaces of the signal processing IC 22 other than the end surface 51 are arranged on an inner side of the signal processing IC die pad 12 than end surfaces of the signal processing IC die pad 12. This manner of keeping a wide distance between the at least one end surface of the signal processing IC 22 and the end surfaces of the signal processing IC die pad 12 enables any size of the signal processing IC 22 to be selected within a range of an area of the signal processing IC die pad 12, and thus a same lead frame can be re-used for general purposes in various products having different forms of signal processing.

Figure 2:
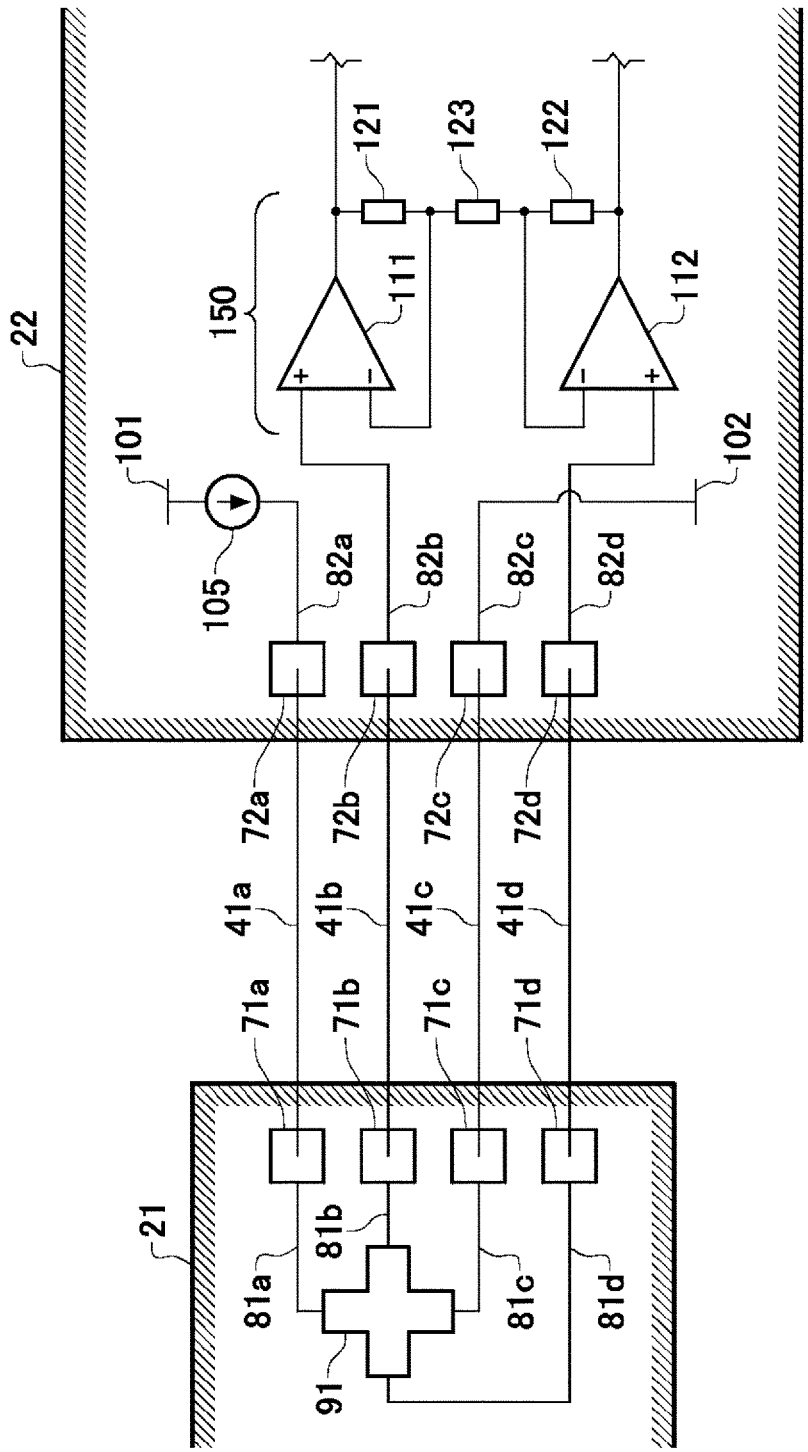
FIG. 2 illustrates one example of a signal processing circuit including a magnetoelectric conversion element of the magnetic sensor.

FIG. 2 illustrates one example of a signal processing circuit including the magnetoelectric conversion element 21 of the magnetic sensor 1. In the drawing, components having the same functionality as those of FIGS. 1A and 1B are denoted with the same reference signs. A wire 41*a*, wire 41*b*, wire 41*c* and wire 41*d* electrically connect electrode pads 71*a* and 72*a*, electrode pads 71*b* and 72*b*, electrode pads 71*c* and 72*c*, and electrode pads 71*d* and 72*d*, respectively. A wiring 81*a*, wiring 81*b*, wiring 81*c* and wiring 81*d* electrically connect the electrode pads 71*a*, 71*b*, 71*c*, and 71*d* and a magnetoelectric converter 91. The wiring 82*a* electrically connects the electrode pad 72*a* and a constant current source 105. The wiring 82*b* electrically connects the electrode pad 72*b* and a noninverting input terminal of an operational amplifier 111. The wiring 82*c* grounds the electrode pad 72*c*. The wiring 82*d* electrically connects the electrode pad 72*d* and a noninverting input terminal of an operational amplifier 112. A resistor 121, a resistor 123, and a resistor 122 are connected in series. One end of the resistor 121 is electrically connected to an output terminal of the operational amplifier 111. The other end of the resistor 121 is electrically connected to one end of the resistor 123 and an inverting input terminal of the operational amplifier 111. The other end of the resistor 123 is electrically connected to one end of the resistor 122 and an inverting input terminal of the operational amplifier 112. The other end of the resistor 122 is electrically connected to an output terminal of the operational amplifier 112. The operational amplifiers 111 and 112, and the resistors 121, 123, and 122 constitute an instrumentation amplifier 150.

The magnetoelectric converter 91 of the magnetoelectric conversion element 21 is a hall element, for example. The magnetoelectric converter 91 has two pairs of terminals, terminals in each pair facing each other. One of the pair of the terminals facing each other is connected to the electrode pad 71*a* through the wiring 81*a*, and the other is connected to the electrode pad 71*c* through the wiring 81*c*. One of another pair of the terminals facing each other is connected to the electrode pad 71*b* through the wiring 81*b*, and the other is connected to the electrode 71*d* through the wiring 81*d*.

The signal processing circuit of the signal processing IC 22 has a first electric potential 101 and a second electric potential 102. The first electric potential 101 is supplied with power potential, and the second electric potential 102 is supplied with ground potential. The first electric potential 101 is connected to the constant current source 105, and then is connected to the electrode pad 72*a* through the wiring 82*a*. The second electric potential 102 is connected to the electrode pad 72*c* through the wiring 82*c*. The signal processing circuit of the signal processing IC 22 has the instrumentation amplifier 150. The instrumentation amplifier 150 is constituted by the operational amplifiers 111 and 112, and the three resistors 121 to 123. The instrumentation amplifier 150 amplifies signals input into two input terminals, and outputs them from two output terminals. A gain of the instrumentation amplifier 150 is adjusted to a desired gain by means of the three resistors 121 to 123. One of two input terminals of the instrumentation amplifier 150 is connected to the electrode pad 72*b* through the wiring 82*b*, and the other is connected to the electrode pad 72*d* through the wiring 82*d*.

The wires 41*a*, 41*b*, 41*c* and 41*d* are respectively connected to the electrode pads 71*a* and 72*a*, the electrode pads 71*b* and 72*b*, the electrode pad 71*c* and 72*c*, and the electrode pad 71*d* and 72*d*.

One pair of the terminals facing each other of the magnetoelectric converter 91 of the magnetoelectric conversion element 21 is supplied with constant current from the constant current source 105 of the signal processing IC 22. At this time, an output voltage according to a magnitude of a magnetic field input into the magnetoelectric converter 91 is generated in the other pair of terminals facing each other of the magnetoelectric converter 91. The output voltage in the magnetoelectric converter 91 is transferred to the two input terminals of the instrumentation amplifier 150 through the wires 41*b* and 41*d*.

Here, if the wires 41*b* and 41*d* receive a strong electric field from an outside, electrostatic coupling is caused from stray capacitance, and thereby an unexpected noise voltage is generated. Also, when seen from the two input terminals of the instrumentation amplifier 150, the wires 41*b* and 41*d* form a closed loop with the wirings 81*b* and 82*b*, the magnetoelectric converter 91, the wirings 81*d* and 82*d*. Accordingly, if a magnetic field of a high frequency is received from an outside, inductive coupling is caused from the closed loop, and thereby an unexpected noise voltage is generated. The noise voltages generated by the electrostatic coupling and the inductive coupling are dependent on lengths of the wires 41*b* and 41*d*, i.e., the longer the wires are, the greater they are. That is, the shorter the lengths of the wires 41*b* and 41*d*, the more an impact of the external noise can be reduced.

The signal processing circuit including the magnetoelectric conversion element 21 of the magnetic sensor 1 is not limited to the above. Instead of the instrumentation amplifier 150, two inverting amplifiers may be used for amplifying the output voltage from the magnetoelectric converter 91. Further, the magnetoelectric converter 91 may be supplied with a constant voltage instead of the constant current. Furthermore, a switch may be inserted in the wirings 82*a* to 82*d* in order to switch operation of the magnetoelectric converter 91.

Figure 3A:
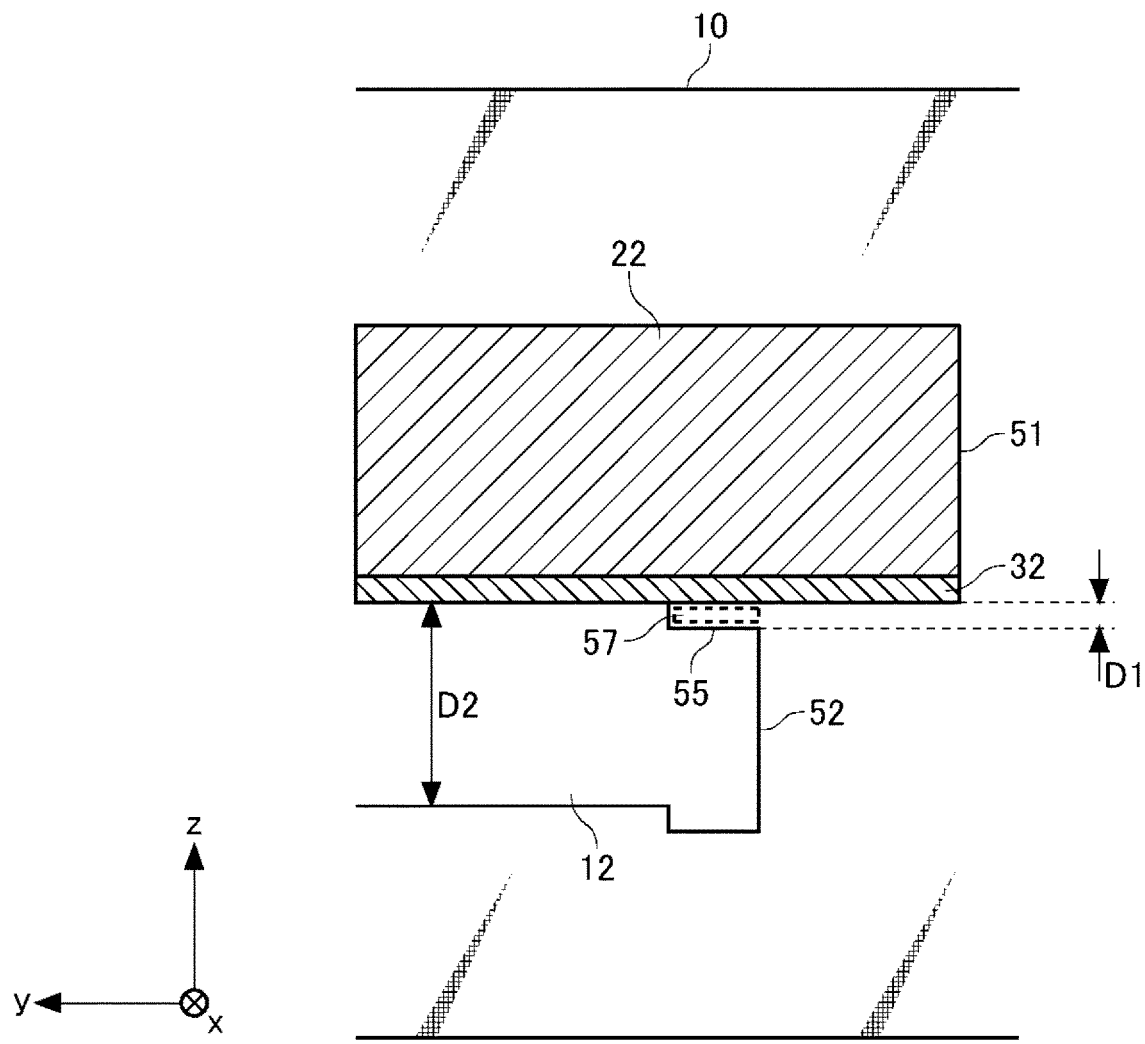
FIG. 3A illustrates an example in which a stepped surface is provided on an end side of an end surface of a signal processing IC die pad of FIG. 1B on a +z axis direction side.
Figure 3B:
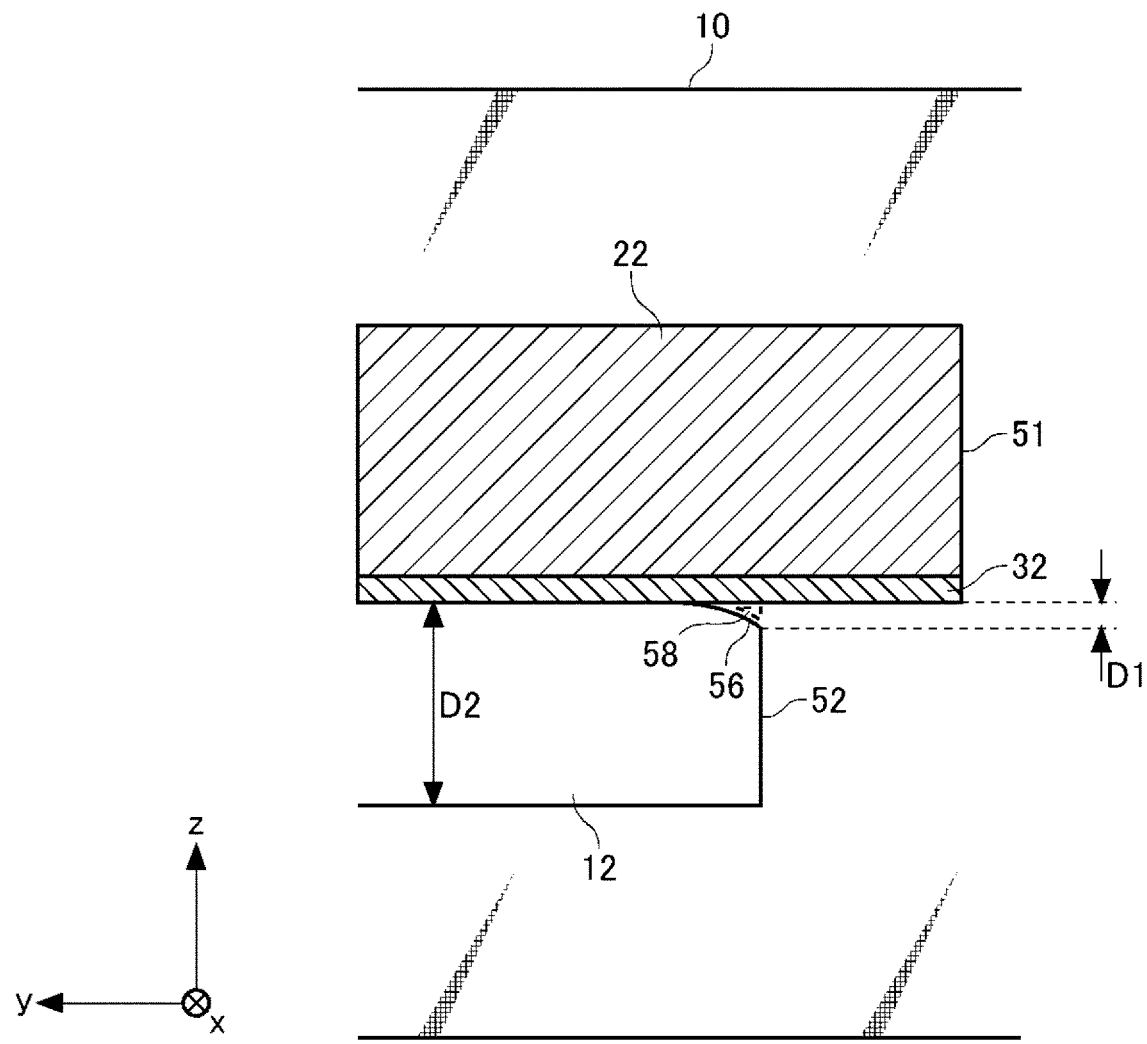
FIG. 3B illustrates an example in which a sloped surface is provided on an end side of an end surface of a signal processing IC die pad of FIG. 1B on a +z axis direction side.

FIGS. 3A and 3B illustrate an enlarged view of a portion of the signal processing IC 22 of FIG. 1B protruding from the signal processing IC die pad 12. In the drawings, components having the same functionality as those of FIGS. 1A and 1B are denoted with the same reference signs.

FIG. 3A illustrates an example in which a stepped surface 55 is provided on an end side of an end surface 52 of a signal processing IC die pad 12 on a +z axis direction side. The stepped surface 55 is provided such that an isolation portion 57 into which the molding resin 10 enters is formed between a surface of the signal processing IC die pad 12 facing the signal processing IC 22, and a surface of the signal processing IC 22 facing the signal processing IC die pad 12. The stepped surface 55 is provided such that the isolation portion 57 into which the molding resin 10 enters is formed between the die-attach film 32 and the signal processing IC die pad 12. A thickness D1 of the isolation portion 57 is smaller than a thickness D2 of the signal processing IC die pad 12. For example, the stepped surface 55 may be formed by etching the lead frame followed by half-blanking or coining. Alternatively, the stepped surface 55 may be formed in reverse order of half-blanking or coining the lead frame followed by etching. A method for forming the stepped surface 55 is not limited to what is described herein. The thickness D1 of the isolation portion 57 is preferably within a range from 0.05 mm to 0.2 mm when the thickness D2 of the signal processing IC die pad 12 is 0.3 mm or more.

FIG. 3B illustrates an example in which a sloped surface 56 is provided on an end side of an end surface 52 of a signal processing IC die pad 12 on a +z axis direction side. The sloped surface 56 is provided such that an isolation portion 58 into which the molding resin 10 enters is formed between a surface of the signal processing IC die pad 12 facing the signal processing IC 22, and a surface of the signal processing IC 22 facing the signal processing IC die pad 12. The sloped surface 56 is provided such that the isolation portion 58 into which the molding resin 10 enters is formed between the die-attach film 32 and the signal processing IC die pad 12. A thickness D1 of the isolation portion 58 is smaller than a thickness D2 of the signal processing IC die pad 12. For example, the sloped surface 56 may be formed by stamping the lead frame. A method for forming the sloped surface 56 is not limited to what is described herein. The thickness D1 of the isolation portion 58 is preferably within a range of from 0.05 mm to 0.2 mm when the thickness D2 of the signal processing IC die pad 12 is 0.3 mm or more.

Figure 4A:
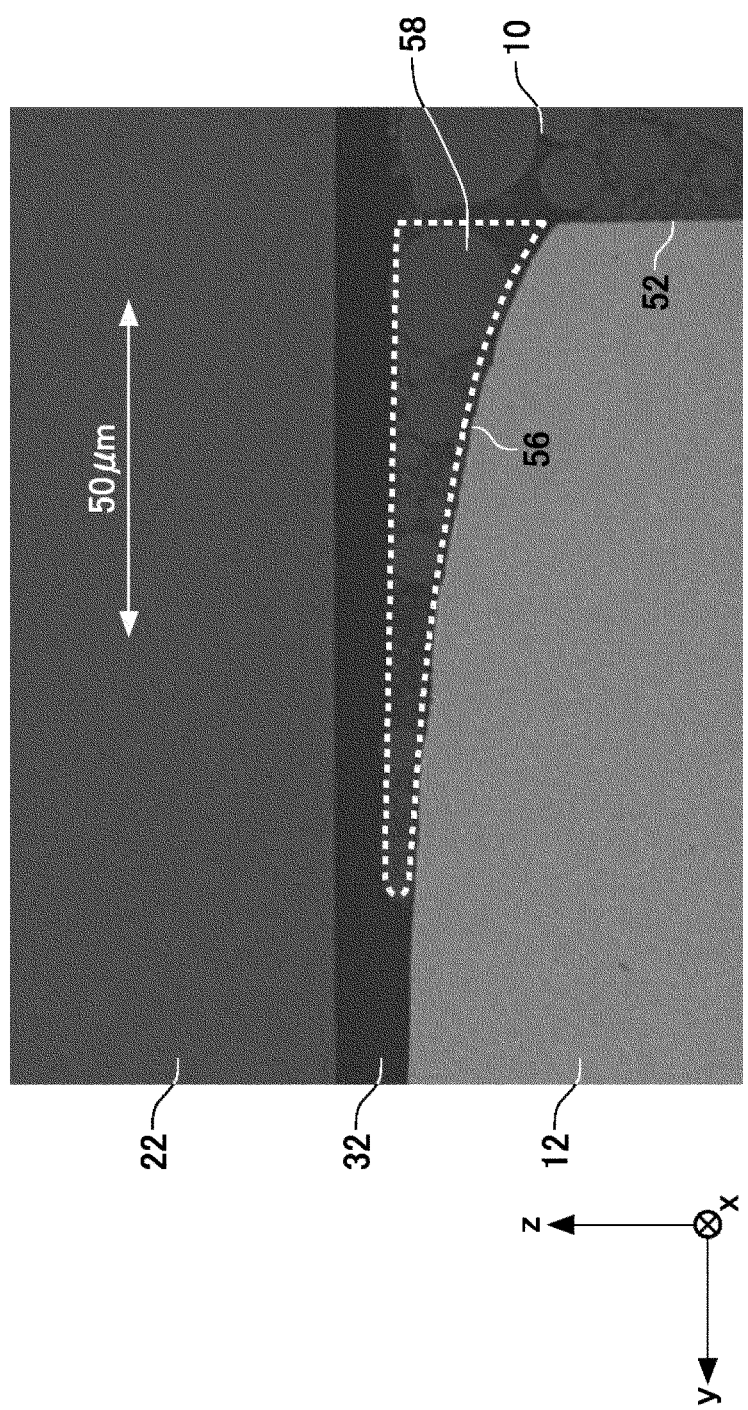
FIG. 4A illustrates a result of a SEM cross-section observation in a case of forming a sloped surface on an end surface of a signal processing IC die pad, where a vicinity of an upper end of an end surface of a signal processing IC die pad is observed after a reliability testing of moisture absorption/reflow.
Figure 4B:
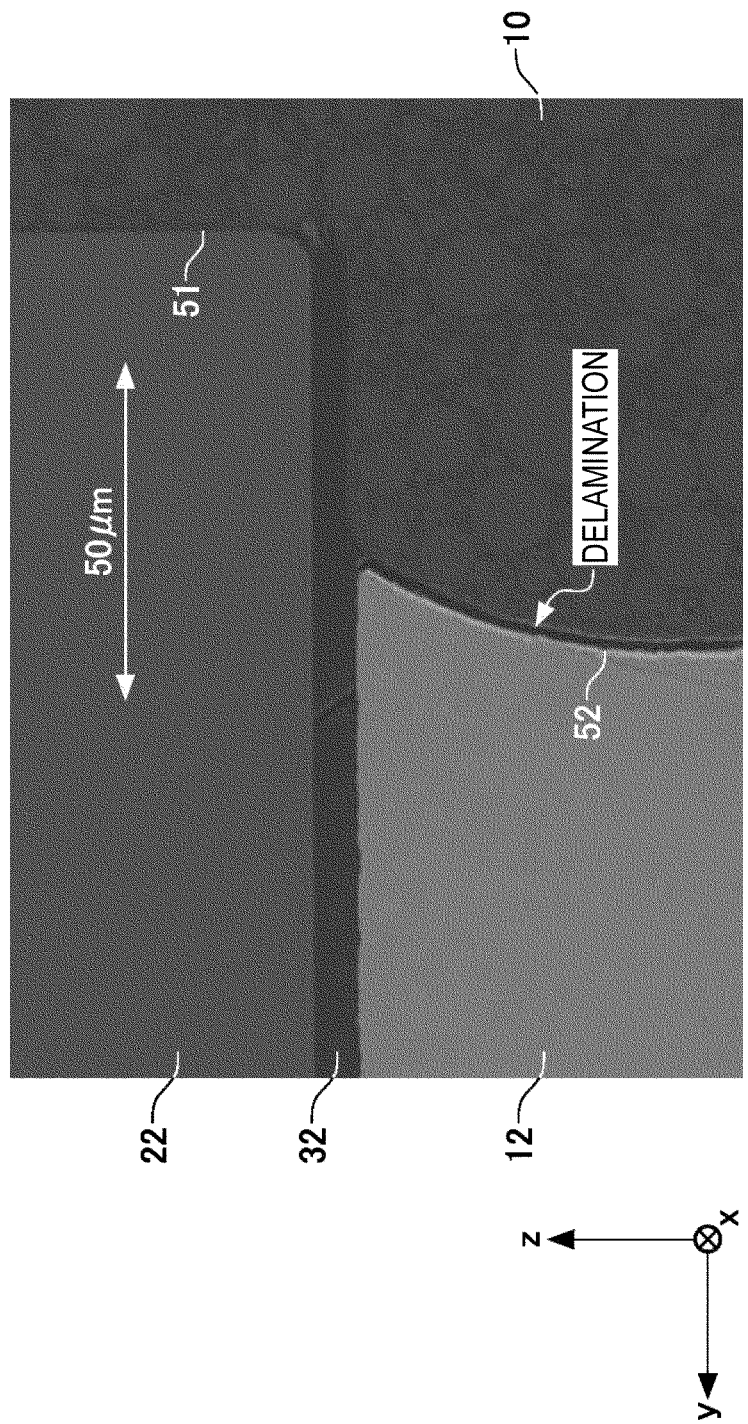
FIG. 4B illustrates a result of a SEM cross-section observation in a case in which only etching has been processed on a lead frame, where a vicinity of an upper end of an end surface of a signal processing IC die pad is observed after a reliability testing of moisture absorption/reflow.

FIGS. 4A and 4B illustrate a result of a SEM cross-section observation where a vicinity of an upper end of an end surface 52 of a signal processing IC die pad 12 is observed after a reliability testing of moisture absorption/reflow. FIG. 4A illustrates a result for the magnetic sensor 1 in which the sloped surface 56 is formed on the end surface 52 of the signal processing IC die pad 12. FIG. 4B illustrates a result for a magnetic sensor when only etching has been processed on a lead frame. In the drawings, components having the same functionality as those of FIGS. 3A and 3B are denoted with the same reference signs.

In FIG. 4A, there is the sloped surface 56 on an end side of the end surface 52 of the signal processing IC die pad 12 on a +z axis direction side. The molding resin 10 enters into and firmly adheres to the isolation portion 58 corresponding to a space between the die-attach film 32 and the sloped surface 56 of the signal processing IC die pad 12. Since the molding resin 10 has adhesive strength increased at the sloped surface 56 for adhering to the signal processing IC die pad 12, the die-attach film 32 is prevented from experiencing hygroscopic swelling, and thermal expansion under a high temperature. Hence, no delamination occurred on the end surface 52. On the other hand, in FIG. 4B, there is no stepped surface 55 or sloped surface 56 on an end side of the end surface 52 of the signal processing IC die pad 12 on +z axis direction side. In FIG. 4B, there is no isolation portion 57 or isolation portion 58. Because of that, the molding resin 10 failed in preventing the die-attach film 32 from experiencing hygroscopic swelling and thermal expansion under a high temperature. Hence, delamination occurred on the end surface 52. Moreover, although unillustrated, minor cracks occurred which extend from an end side of the end surface 52 on a −z axis direction side to the molding resin 10. As above, the magnetic sensor 1 having an excellent quality without any delamination or crack can be provided by having a configuration provided with: the stepped surface 55 or the sloped surface 56; and the isolation portion 57 or the isolation portion 58 into which the molding resin 10 enters, between the surface on a side of the end surface 52 of the signal processing IC die pad 12 facing the signal processing IC 22, and the surface of the signal processing IC 22 facing the signal processing IC die pad 12.

Note that, the molding resin 10 is directly adhered to the signal processing IC die pad 12 in a vicinity of end surfaces of the signal processing IC 22 except the end surface 51. Since the molding resin 10 has adhesive strength increased for adhering to the signal processing IC die pad 12, the die-attach film 32 is prevented from experiencing hygroscopic swelling, and thermal expansion under a high temperature. Again, delamination and cracks can be prevented. The end surfaces of the signal processing IC 22 except the end surface 51 are directly adhered to the signal processing IC die pad 12 with the die-attach film 32.

Although the signal processing IC die pad 12 has been described as having a C-shape in the plan views of FIGS. 1A and 1B, it can be in a rectangular shape. An entire end surface 51 of the signal processing IC 22 may be arranged on an outer side of the signal processing IC die pad 12 than the end surface 52 of the signal processing IC die pad 12 facing the magnetoelectric conversion element 21.

Figure 5A:
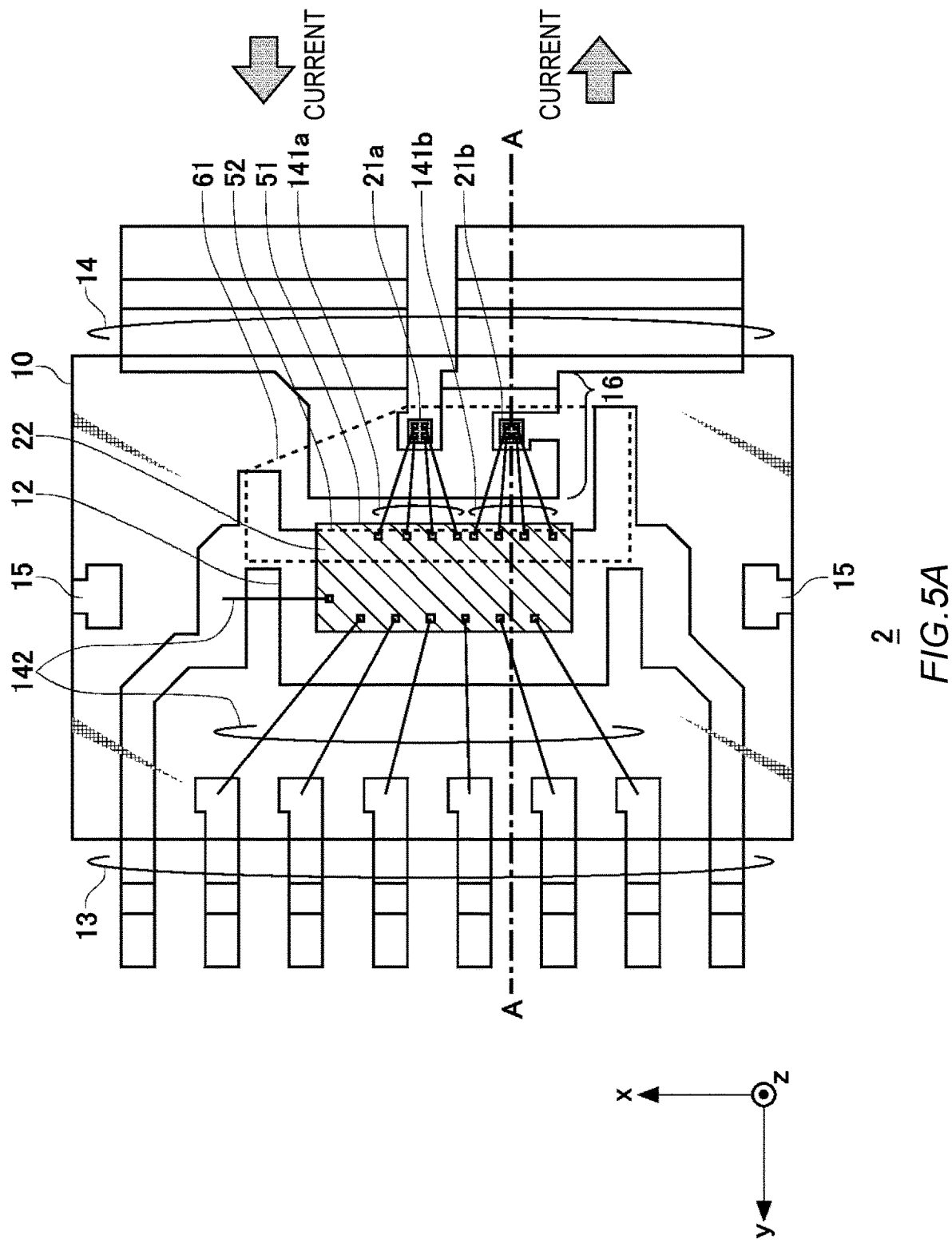
FIG. 5A is a top view of a configuration inside a semiconductor package for functioning as a magnetic sensor according to a second embodiment.
Figure 5B:
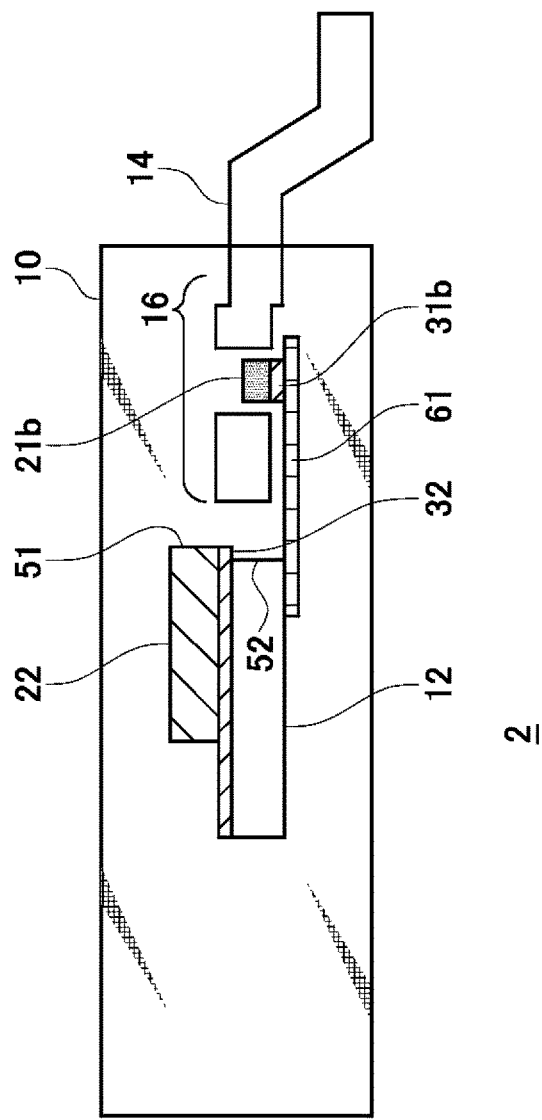
FIG. 5B is a cross-section taken along a line A-A of FIG. 5A.

FIGS. 5A and 5B illustrate a configuration inside a semiconductor package of a magnetic sensor 2 according to a second embodiment. FIG. 5A is a top view of a plan view seen from the z axis direction. FIG. 5B is a cross-section taken along a line A-A of FIG. 5A. In the drawing, components having the same functionality as those of FIGS. 1A and 1B are denoted with the same reference signs. The magnetic sensor 2 has lead terminals 14, suspension leads 15, a magnetoelectric conversion element 21a, a magnetoelectric conversion element 21b, a die-attach film 31a, a die-attach film 31b, wires 141a, wires 141b, and an insulator film 61.

The magnetic sensor 2 according to the second embodiment has the magnetoelectric conversion elements 21a and 21b detecting a magnetic field in a particular direction generated by current flowing into the lead terminals 14. A signal processing IC 22 amplifies a signal according to a magnitude of the current, and the amplified signal is output from a lead terminal 13.

The lead terminals 14 has two terminals, where current flows from one terminal to the other terminal. A primary conductor 16 connected to the lead terminals 14 is arranged around the magnetoelectric conversion elements 21a and 21b. The primary conductor 16 has a shape formed by connecting a C-shape and an inverted U-shape in the plan view. The magnetoelectric conversion element 21a is arranged in an opening of the C-shape of the primary conductor 16, and the magnetoelectric conversion element 21b is arranged in an opening of the inverted U-shape of the primary conductor 16. A magnetic field is generated around current flowing in the primary conductor 16, according to a magnitude of the current and a distance from the primary conductor 16. At positions of the magnetoelectric conversion elements 21a and 21b, such a magnetic field of which component in the z axis direction is the largest is generated. Since the magnetoelectric conversion elements 21a and 21b are arranged in the openings, high sensitivity can be obtained for current.

When the current flowing in the primary conductor 16 is supplied in a direction shown by arrows in the drawing, a magnetic field is generated toward the +z axis direction side at a position of the magnetoelectric conversion element 21a, and a magnetic field is generated toward the −z axis direction side at a position of the magnetoelectric conversion element 21b. Output voltages of the magnetoelectric conversion elements 21a and 21b are positive and negative, or negative and positive. Therefore, in a signal processing circuit, a signal according to a magnitude of current can be obtained by calculating a difference in the output voltages of the magnetoelectric conversion elements 21a and 21b. On the other hand, an external magnetic field, e.g., the Earth's magnetic field can be compensated by calculating the difference in the output voltages of the magnetoelectric conversion elements 21a and 21b which are the same positive or negative voltages.

The magnetoelectric conversion elements 21a and 21b have a rectangular shape or a square shape in the plan view. The magnetoelectric conversion elements 21a and 21b have a substrate consisting of silicon or compound semiconductor, and a magnetoelectric converter disposed on the substrate. A thickness of the substrate is adjusted by polishing its surface on a −z axis direction side. The substrate has a desired thickness ranging from 50 μm to 600 μm. Because the magnetic field in the z axis direction will be detected, a hall element is appropriate for the magnetoelectric conversion element of the drawing. Alternatively, if the magnetoelectric conversion element is arranged at a position for detecting a magnetic field in any one axis direction on the x-y plane, e.g., if it is arranged at a position for detecting a magnetic field in the x axis direction, a magneto-resistance element or a flux-gate element is appropriate for the magnetoelectric conversion element.

The signal processing IC 22 has a rectangular shape or a square shape in a plan view. The signal processing IC 22 has a substrate consisting of silicon or compound semiconductor, and a signal processing circuit disposed on the substrate. A thickness of the substrate is adjusted by polishing its surface on a −z axis direction side. The substrate has a desired thickness ranging from 50 μm to 600 μm. The signal processing circuit of the signal processing IC 22 has at least a circuit to input a quite small output signal from the magnetoelectric conversion element according to a magnitude of a magnetic field, and to amplify an input signal. The signal processing IC 22 is arranged not to be overlapped with the primary conductor 16 in the plan view.

The wires 141a electrically connect electrode pads disposed on the signal processing IC 22 and electrode pads disposed on the magnetoelectric conversion element 21a, and the wires 141b electrically connect electrode pads disposed on the signal processing IC 22 and electrode pads disposed on the magnetoelectric conversion element 21b. The wires 142 electrically connect electrode pads disposed on the signal processing IC 22 and bonding pads disposed on the lead terminals 13. The wires 141a, 141b, and 142 are formed of a conductor material of which main component being Au, Ag, Cu, or Al.

The signal processing IC die pad 12, lead terminals 13 and 14, and suspension leads 15 are formed from a lead frame made of a conductor material of which main component being Cu. The lead frame has a desired thickness ranging from 50 μm to 600 μm. A signal processing IC die pad 12 is a land for placing the signal processing IC 22. The signal processing IC die pad 12 is formed in a tabular shape on an x-y plane, and arranged not to be overlapped with the primary conductor 16 when seen from a +z axis direction, and to be overlapped with at least a part of the primary conductor 16 when seen from a +y axis direction. The lead terminals 13 are leads for supplying power to the signal processing circuit of the signal processing IC 22, and for inputting/outputting signals. The suspension leads 15 are leads for supporting a molded molding resin 10 during an assembly process.

The insulator film 61 is a rectangular tape when seen in the plan view. The insulator film 61 has an adhesive layer on a surface on the +z axis direction side. A part of the adhesive layer of the insulator film 61 is adhered to a part of a surface of a lead including the signal processing IC die pad 12 on the −z axis direction side, and arranged so as to protrude to the positions of the magnetoelectric conversion elements 21a and 21b. The primary conductor 16 has a step provided by half-blanking, so that the insulator film 61 and the primary conductor 16 do not contact with each other. This step may be selected to be in a range from 10 μm to 400 μm, depending on a thickness of a lead frame. Polyimide resin is appropriate for the insulator film 61 because the insulator film 61 is ideally made of a material having a resistance against high temperature in the assembly process.

A die-attach film 31a (unillustrated) and a die-attach film 31b are adhesive layers respectively bonding the magnetoelectric conversion element 21a to the insulator film 61, and the magnetoelectric conversion element 21b to the insulator film 61. A die-attach film 32 is an adhesive layer for bonding the signal processing IC 22 and the signal processing IC die pad 12 together. In the plan view, the die-attach film 31a, the die-attach film 31b, and the die-attach film 32 are respectively identical in shape with the magnetoelectric conversion element 21a, the magnetoelectric conversion element 21b, and the signal processing IC 22. The die-attach films 31a, 31b, and 32 may consist of non-conductive resin, or conductive resin. The non-conductive resin includes epoxy-based resin. The conductive resin includes epoxy-based resin mixed with Ag filler. The die-attach films 31a, 31b, and 32 have a desired thickness ranging from 1 μm to 50 μm.

For example, thermosetting epoxy resin added with silica is used for the molding resin 10, and the semiconductor package is molded by transfer molding. Molded molding resin 10 completely encapsulates the magnetoelectric conversion elements 21a and 21b, the signal processing IC 22, the wires 141a, 141b, and 142.

In the plan view of the magnetic sensor 2, among four sides of the signal processing IC 22 in a rectangular shape or a square shape, the entire end surface 51 on a side of the magnetoelectric conversion elements 21a and 21b including a side of the four closest to the magnetoelectric conversion elements 21a and 21b is arranged on an outer side of the signal processing IC die pad 12 than an end surface 52 on the side of the magnetoelectric conversion elements 21a and 21b. This shortens lengths of the wires 141a and 141b connecting the signal processing IC 22 and the magnetoelectric conversion elements 21a and 21b, and thereby unexpected external noise can be reduced. Further, an outline of the semiconductor package in the y axis direction becomes smaller, so that the magnetic sensor can be miniaturized.

In the plan view of the magnetic sensor 2 of the present embodiment 2, at least one end surface, preferably three end surfaces of the signal processing IC 22 other than the end surface 51 are arranged on an inner side of the signal processing IC die pad 12 than end surfaces of the signal processing IC die pad 12. This manner of keeping a wide distance between the at least one end surface of the signal processing IC 22 and the end surfaces of the signal processing IC die pad 12 enables any size of the signal processing IC 22 to be selected within a range of an area of the signal processing IC die pad 12, and thus a same lead frame can be re-used for general purposes in various products having different forms of signal processing.

The example of the signal processing circuit including the magnetoelectric conversion elements 21a and 21b has almost the same structure as that of FIG. 2, except that the primary conductor 16 is arranged close to the wires 141a and 141b. Because the primary conductor 16 generates a strong electric field or a magnetic field of a high frequency, again, the shorter the lengths of the wires 141a and 141b are, the more impact of external noise can be reduced.

Figure 6A:
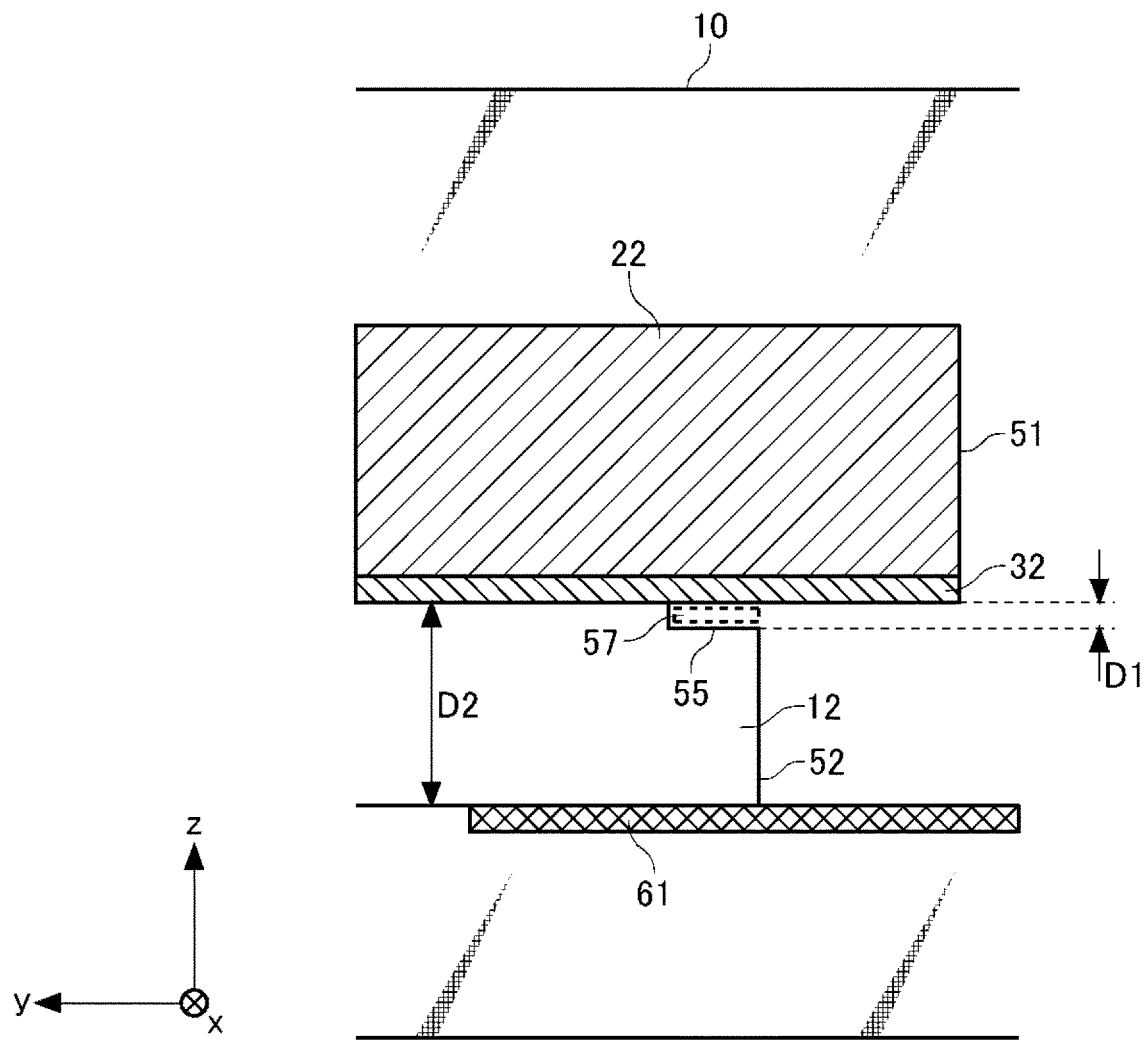
FIG. 6A illustrates an example in which a stepped surface is provided on an end side of an end surface of a signal processing IC die pad of FIG. 5B on a +z axis direction side.
Figure 6B:
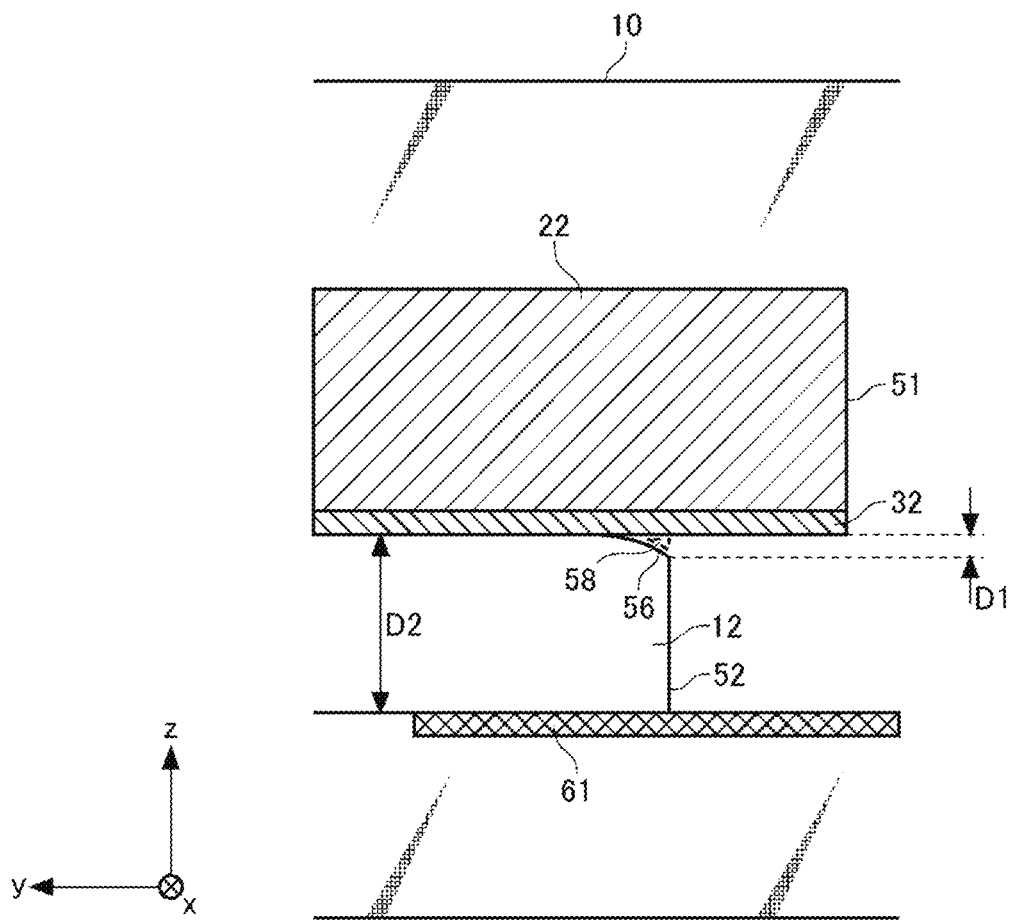
FIG. 6B illustrates an example in which a sloped surface is provided on an end side of an end surface of a signal processing IC die pad of FIG. 5B on a +z axis direction side.

FIGS. 6A and 6B illustrate an enlarged view of a portion of the signal processing IC 22 of FIG. 5B protruding from the signal processing IC die pad 12. In the drawings, components having the same functionality as those of FIGS. 3A, 3B, 5A and 5B are denoted with the same reference signs.

FIG. 6A illustrates an example in which a stepped surface 55 is provided on an end side of an end surface 52 of a signal processing IC die pad 12 on a +z axis direction side. Similar to that of FIG. 3A, the stepped surface 55 is provided such that an isolation portion 57 into which the molding resin 10 enters is formed between a surface of the signal processing IC die pad 12 facing the signal processing IC 22, and a surface of the signal processing IC 22 facing the signal processing IC die pad 12. A thickness D1 of the isolation portion 57 is smaller than a thickness D2 of the signal processing IC die pad 12. The stepped surface 55 is provided such that the isolation portion 57 into which the molding resin 10 enters is formed between the die-attach film 32 and the signal processing IC die pad 12. The thickness D1 of the isolation portion 57 is preferably within a range of from 0.05 mm to 0.2 mm when the thickness D2 of the signal processing IC die pad 12 is 0.3 mm or more.

FIG. 6B illustrates an example in which a sloped surface 56 is provided on an end side of an end surface 52 of a signal processing IC die pad 12 on a +z axis direction side. Similar to that of FIG. 3B, the sloped surface 56 is provided such that an isolation portion 58 into which the molding resin 10 enters is formed between a surface of the signal processing IC die pad 12 facing the signal processing IC 22, and a surface of the signal processing IC 22 facing the signal processing IC die pad 12. A thickness D1 of the isolation portion 58 is smaller than a thickness D2 of the signal processing IC die pad 12. The sloped surface 56 is provided such that the isolation portion 58 into which the molding resin 10 enters is formed between the die-attach film 32 and the signal processing IC die pad 12. The thickness D1 of the isolation portion 58 is preferably within a range from 0.05 mm to 0.2 mm when the thickness D2 of the signal processing IC die pad 12 is 0.3 mm or more.

Similar to that of FIG. 4A, in the magnetic sensor of the present embodiment 2 having the sloped surface 56 formed on the end surface 52 of the signal processing IC die pad 12, the molding resin 10 has adhesive strength increased at the sloped surface 56 for adhering to the signal processing IC die pad 12 after a reliability testing of moisture absorption/reflow. Thereby, the die-attach film 32 is prevented from experiencing hygroscopic swelling, and thermal expansion under a high temperature. Hence, no delamination occurred on the end surface 52. On the other hand, in a magnetic sensor in which only etching has been processed on a lead frame, a molding resin 10 failed in preventing a die-attach film 32 from experiencing hygroscopic swelling and thermal expansion under a high temperature. Hence, delamination occurred on an end surface 52. Moreover, minor cracks occurred which extend from an end side of the end surface 52 on a −z axis direction side to the molding resin 10. As above, the magnetic sensor 2 having an excellent quality without any delamination or crack can be provided by having a configuration provided with: the stepped surface 55 or the sloped surface 56; and the isolation portion 57 or the isolation portion 58 into which the molding resin 10 enters, between the end surface 52 of the signal processing IC die pad 12 and the signal processing IC 22.

Note that, the molding resin 10 is directly adhered to the signal processing IC die pad 12 in a vicinity of end surfaces of the signal processing IC 22 except the end surface 51.

Since the molding resin 10 has adhesive strength increased for adhering to the signal processing IC die pad 12, the die-attach film 32 is prevented from experiencing hygroscopic swelling, and thermal expansion under a high temperature. Again, delamination and cracks can be prevented. The end surfaces of the signal processing IC 22 except the end surface 51 are directly adhered to the signal processing IC die pad 12 with the die-attach film 32.

Although the signal processing IC die pad 12 has been described as having a rectangular shape in the plan views of FIGS. 5A and 5B, it can be in a C-shape shape. A part of the end surface 51 of the signal processing IC 22 may be arranged on an outer side of the signal processing IC die pad 12 than the end surface 52 of the signal processing IC die pad 12 facing the magnetoelectric conversion element 21.

While the embodiments of the present invention have been described, the technical scope of the present invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the present invention.

The operations, procedures, steps, and stages etc. of each process performed by an apparatus, system, program, and method shown in the claims, specification, or drawings can be performed in any order as long as the order is not indicated by "prior to," "before," or the like and as long as the output from a previous process is not used in a later process. Even if the operational flow is described using phrases such as "first" or "next" in the claims, specification, or drawings, it does not necessarily mean that the process must be performed in this order.

EXPLANATION OF REFERENCES 1, 2: magnetic sensor; 10: molding resin; 11: magnetoelectric conversion element die pad; 12: die pad; 13, 14: lead terminals; 15: leads; 16: primary conductor; 21, 21a, 21b: magnetoelectric conversion element; 22: signal processing IC; 31, 31a, 31b, 32: die-attach film; 41, 41a, 41b, 41c, 41d, 42, 141a, 141b, 142: wires; 51, 52: end surface; 55: stepped surface; 56: sloped surface; 57, 58: isolation portion; 61: insulator film; 71a, 71b, 71c, 71d, 72a, 72b, 72c, 72d: electrode pad; 81a, 81b, 81c, 81d, 82a, 82b, 82c, 82d: wiring; 91: magnetoelectric converter; 101: first electric potential; 102: second electric potential; 105: constant current source; 111, 112: operational amplifier; 121, 122, 123: resistor; 150: instrumentation amplifier

What is claimed is:

1. A magnetic sensor, comprising:

a die pad;

a signal processing IC arranged facing a first surface of the die pad;

an adhesive layer comprising a die-attach film arranged between the first surface of the die pad and a first surface of the signal processing IC facing the die pad; and at least one magnetoelectric conversion element which is arranged facing a first end surface of the signal processing IC, and which is for detecting a magnetic field in a particular direction, wherein the die pad, the signal processing IC, the adhesive layer, and the at least one magnetoelectric conversion element are encapsulated by a molding resin, the die pad having a stepped shape or a concave shape that is downward sloping away from the signal processing IC, the stepped shape or the concave shape forming an isolation portion located between the first surface of the die pad and the adhesive layer, the isolation portion being an opening between the die pad and the adhesive layer, the isolation portion filled with the molding resin, wherein a thickness of the isolation portion is smaller than a thickness of the die pad, and at least a part of the first end surface of the signal processing IC extends outwardly beyond, and is parallel to, a first end surface of the die pad in a plan view and is positioned closer to the at least one magnetoelectric conversion element than the first end surface of the die pad having the isolation portion on a side of the at least one magnetoelectric conversion element in the plan view.

2. The magnetic sensor according to claim 1, wherein at least one end surface of the signal processing IC other than the first end surface of the signal processing IC is arranged perpendicularly to, and above, the first surface of the die pad.

3. The magnetic sensor according to claim 2, wherein a part of the first surface of the signal processing IC where it adjoins the at least one end surface of the signal processing IC other than the first end surface of the signal processing IC is directly adhered to the first surface of the die pad with the adhesive layer.

4. The magnetic sensor according to claim 1, further comprising:
a conductor arranged around the at least one magnetoelectric conversion element and configured to have a current flow therein.

5. The magnetic sensor according to claim 4, wherein the conductor has an opening, and the at least one magnetoelectric conversion element is arranged in the opening.

6. The magnetic sensor according to claim 1, further comprising:
a conductor arranged around the at least one magnetoelectric conversion element and configured to have a current flow therein, wherein
an end surface of the signal processing IC other than the first end surface of the signal processing IC is arranged perpendicularly to, and above, the first surface of the die pad.

7. The magnetic sensor according to claim 6, wherein the conductor has an opening, and the at least one magnetoelectric conversion element is arranged in the opening.

8. The magnetic sensor according to claim 6, wherein a part of the first surface of the signal processing IC where it adjoins the end surface of the signal processing IC other than the first end surface of the signal processing IC is directly adhered to the first surface of the die pad with the adhesive layer.

9. The magnetic sensor according to claim 8, wherein the conductor has an opening, and the at least one magnetoelectric conversion element is arranged in the opening.

10. The magnetic sensor according to claim 1, wherein the at least one magnetoelectric conversion element is a plurality of magnetoelectric conversion elements.

11. The magnetic sensor according to claim 1, wherein
an end surface of the signal processing IC other than the first end surface of the signal processing IC is arranged perpendicularly to, and above, the first surface of the die pad, and
the at least one magnetoelectric conversion element is a plurality of magnetoelectric conversion elements.

12. The magnetic sensor according to claim 11, wherein a part of the first surface of the signal processing IC where it adjoins the end surface of the signal processing IC other than the first end surface of the signal processing IC is directly adhered to the first surface of the die pad with the adhesive layer.

13. The magnetic sensor according to claim 11, further comprising:
a conductor arranged around the at least one magnetoelectric conversion element and configured to have a current flow therein.

14. The magnetic sensor according to claim 13, wherein the conductor has an opening, and the at least one magnetoelectric conversion element is arranged in the opening.

15. The magnetic sensor according to claim 1, wherein the at least one magnetoelectric conversion element is a hall element.

16. The magnetic sensor according to claim 1, wherein
an end surface of the signal processing IC other than the first end surface of the signal processing IC is arranged perpendicularly to, and above, the first surface of the die pad, and
the at least one magnetoelectric conversion element is a hall element.

17. The magnetic sensor according to claim 16, wherein a part of the first surface of the signal processing IC where it adjoins the end surface of the signal processing IC other than the first end surface of the signal processing IC is directly adhered to the first surface of the die pad with the adhesive layer.

18. The magnetic sensor according to claim 16, further comprising:
a conductor arranged around the at least one magnetoelectric conversion element and configured to have a current flow therein.

19. The magnetic sensor according to claim 18, wherein the conductor has an opening, and the at least one magnetoelectric conversion element is arranged in the opening.

* * * * *